United States Patent [19]
Burgess et al.

[11] Patent Number: 5,304,626
[45] Date of Patent: Apr. 19, 1994

[54] POLYIMIDE COPOLYMERS CONTAINING 3,3',4,4'-TETRACARBOXYBIPHENYL DIANHYDRIDE (BPDA) MOIETIES

[75] Inventors: Marvin J. Burgess, Lisle; Douglas E. Fjare; Herbert J. Neuhaus, both of Naperville, all of Ill.

[73] Assignee: Amoco Corporation, Chicago, Ill.

[21] Appl. No.: 759,426

[22] Filed: Sep. 13, 1991

Related U.S. Application Data

[63] Continuation-in-part of Ser. No. 463,147, Dec. 22, 1989, Pat. No. 5,089,593, which is a continuation-in-part of Ser. No. 212,511, Jun. 28, 1988, abandoned.

[51] Int. Cl.$^5$ ............ C08C 69/26; C08C 73/10
[52] U.S. Cl. ............................. 528/353; 528/33; 528/125; 528/128; 528/170; 528/171; 528/172; 528/173; 528/174; 528/175; 528/176; 528/183; 528/185; 528/188; 528/189; 528/220; 528/226; 528/229; 528/350; 528/352
[58] Field of Search ............ 528/125, 33, 128, 170, 528/171, 183, 185, 189, 188, 352, 353, 174, 175, 172, 173, 176, 220, 229, 350

[56] References Cited

U.S. PATENT DOCUMENTS

| | | | |
|---|---|---|---|
| 4,477,648 | 10/1984 | Jones | 528/185 |
| 4,535,101 | 8/1985 | Lee | 528/185 |
| 4,568,715 | 2/1986 | Itatani et al. | 524/348 |
| 4,886,874 | 12/1989 | Nagano | 528/353 |
| 4,923,968 | 5/1990 | Kunimune | 528/125 |
| 5,089,593 | 2/1992 | Fjare et al. | 528/353 |

FOREIGN PATENT DOCUMENTS

| | | |
|---|---|---|
| 0189643 | 5/1985 | European Pat. Off. |
| 0411772 | 9/1990 | European Pat. Off. |
| 0424805 | 10/1990 | European Pat. Off. |

OTHER PUBLICATIONS

"Annex to the International Search Report on International Patent Application No. US 9207703, SA 65350".

Primary Examiner—John Kight, III
Assistant Examiner—P. Hampton-Hightower
Attorney, Agent, or Firm—Rae K. Stuhlmacher; Wallace L. Oliver

[57] ABSTRACT

A chemical resistant copolymer useful in electronic applications, said copolymer is a polyimide containing a 3,3',4,4'-tetracarboxybiphenyl dianhydride (BPDA) moiety, at least one other dianhydride moiety, and at least one diamine.

9 Claims, No Drawings

POLYIMIDE COPOLYMERS CONTAINING 3,3',4,4'-TETRACARBOXYBIPHENYL DIANHYDRIDE (BPDA) MOIETIES

CROSS REFERENCE TO RELATED APPLICATIONS

This application is a continuation-in-part to U.S. Ser. No. 07/463,147 filed Dec. 22, 1989, now U.S. Pat. No. 5,089,593, which is a continuation-in-part to U.S. Ser. No. 212,511 filed Jun. 28, 1988, now abandoned.

BACKGROUND OF THE INVENTION

This invention relates to copolymers and, more particularly, to chemical and solvent resistant polyimides containing 3,3',4,4'-tetracarboxybiphenyl dianhydride (BPDA) moieties.

Aromatic polyimides and polyamide-imides have found extensive use in industry as fibers, composites, molded parts and dielectrics (insulators or non-conductors) due to their toughness, flexibility, mechanical strength and high thermal stability. In the electronic industry, polyimide coatings are widely used as dielectrics in the fabrication of microelectronic devices. The advantages of using polyimides over inorganic dielectrics such as silicon dioxide or silicon nitride, are a low dielectric constant, ease of application, crack resistance, and a tendency to planarize substrate topography better than most inorganic materials.

Dielectrics typically are coated with thin films of a patterned conducting material. As such, they are used to provide an electrical network to interconnect the individual semiconductor devices of an integrated circuit. These electrical networks provide electrical power to, and transfer electrical signals between, individual semiconductor devices. In other words, the dielectrics can be used as a component in a system that provides an electrical interconnection network for an individual semiconductor device which is composed of integrated circuits built on a common substrate. The dielectrics can also be used to form interconnection networks of integrated circuits as part of a multi-chip module or multi-package module.

Essentially, the layers of the interconnection network are layers of patterned conducting material which are separated from the substrate and from each other by layers of dielectric, typically a non-conducting polymer. The conducting layer is etched to form a pattern of current carrying conducting material, typically referred to as conducting lines or traces, over the surface of the underlying dielectric layer. Thereafter, a subsequent layer of dielectric is applied to cover both the trace and the uncovered portions of the underlying dielectric layer. In practice, the subsequent layer of polymer is applied over a topographical (i.e., nonplanar) surface. Where the dielectric is a polymer, the polymer tends to planarize the substrate topography. However, some topography will remain and there will be some areas where the polymer is thinner than other areas. For example, the polymer layer over the trace will be thinner than the polymer layer over the uncovered portions of the underlying dielectric layer.

If the polymer thickness is further reduced by the chemicals or solvents used in subsequent process steps, the thinner regions of polymer coating can be removed to the extent that the conducting material is exposed through the polymer coating. Such exposed conducting material can cause short circuits between conductors. In addition, extremely thin areas or layers of polymer coating can lead to large electric fields which can contribute to the breakdown of the insulating properties of the dielectric.

In addition, two key electrical characteristics, the network capacitance and the speed of signal propagation, are controlled by the dielectric coating thickness. The network capacitance determines the amount of electric charge the semiconductor device must supply to the network in order to transmit a signal. The electronic components are designed to handle a predetermined capacitance and when the polymer coating thickness decreases the capacitance goes up such that it can increase beyond the capability of the electronic components to handle that increase. As a result, the electronic components will not be able to propagate a signal.

Polymer coating thickness can also affect the speed of signal propagation. The integrated circuit is designed to operate at a particular speed of signal propagation and, if signals do not propagate as required, the performance of the integrated circuit will be reduced. In this case, uneven layers of dielectric will impair the electrical performance of the semiconductor device.

Thus, the dielectric coating thickness must be controlled both during the dielectric coating deposition process and during subsequent semiconductor device fabrication processing steps. When the dielectric is a polyimide, the fabrication processing steps, for example, in the case of a typical interconnect network fabrication process, requires a multistep procedure. In this case, the polyimide must be resistant to the chemicals and solvents used in the many steps of the fabrication process.

Accordingly, it is an object of the present invention to provide an improved polyimide composition for microelectronic applications. Another object of the present invention is to provide a polyimide composition which is resistant to the chemicals and solvents used in the many steps of the interconnect fabrication process. A still further object of the present invention is to provide a polyimide composition having advantageous properties. These and other objects and advantages of the present invention will be apparent to those skilled in the art from the following description.

SUMMARY OF THE INVENTION

In general, the objects of this invention can be attained by providing polymer compositions having at least one moiety derived from 3,3',4,4'-tetracarboxybiphenyl dianhydride (BPDA), at least one additional moiety derived from an aromatic dianhydride, and at least one moiety derived from a diamine wherein such compositions are selected from one or more of polyimide and polyamic acid.

More specifically, the objects of this invention can be attained by providing polymer compositions comprising recurring units selected from one or more of the polyimide of Formula I and the polyamic acid of Formula II below

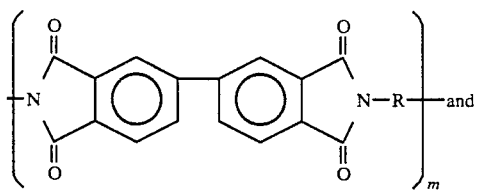

I

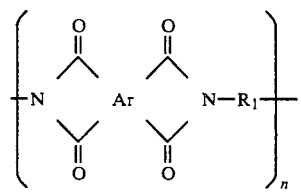

wherein Ar is at least one tetravalent aromatic nucleus with the proviso that Ar is not a 3,3',4,4'-tetracarboxybiphenyl dianhydride (BPDA) moiety; R and $R_1$ are independently selected from divalent hydrocarbon radicals; and

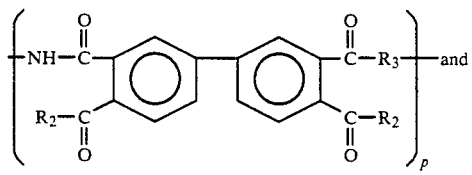

II

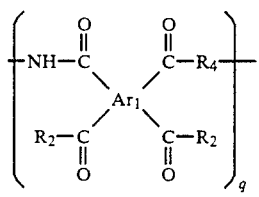

wherein $Ar_1$ is at least one tetravalent aromatic nucleus with the proviso that Ar is not a 3,3',4,4'-tetracarboxybiphenyl dianhydride (BPDA) moiety; $R_3$ and $R_4$ are independently selected from divalent hydrocarbon radicals; $R_2$ is independently selected from halogen, —OH, and —$OR_5$ where $R_5$ is an alkyl group of 1 to 4 carbon atoms; and the ratio of the polyimide of Formula I to the polyamic acid of Formula II (m plus n to p plus q) is from about 0:100 to about 100:0. In otherwords, the polymer compositions can range from 100 percent polyimide to 100 percent polyamic acid.

Ar, $Ar_1$, R, $R_1$, $R_3$, $R_4$, and $R_5$ may be substituted or unsubstituted, for example, with an alkyl group of 1 to 4 carbon atoms or halogen. However, where several fluorinated or bulky groups are incorporated in an attempt to lower the dielectric constant, the solvent resistance of the polyimide may decrease.

In order to provide a copolymer with good processing properties, and the ratio of m plus p to n plus q is from about 1:9 to about 99:1. Best results in terms of chemical or solvent resistance and best dielectric constant are achieved when the ratio of m plus p to n plus q is from about 1:3 to about 1:1. Above about 1:1 there is no perceived advantage in terms of increasing the chemical and solvent resistance of the polyimide. Below about 1:3 the solvent resistance begins to decrease rapidly.

The present invention includes the salts, carboxylic acids, or esters of Formula II. The present invention also includes compositions which have polyimides of Formula I in combination with the polyamic acids of Formula II.

In still another aspect of the present invention, it has been found that a particular synthesis reaction sequence will provide a polyamic acid with a particularly stable viscosity as well as a polyimide with improved chemical and solvent resistance. In particular, where the dianhydrides are mixed or slurried before they are reacted with the diamine, the resulting polyamic acid has a more stable viscosity when measured over time, see Examples 5-7.

Briefly, the copolymers of this invention are useful in electronic applications and can be made into flexible substrates for electrical components, interlevel dielectrics, and the like. The copolymers of the present invention provide a unique chemical and solvent resistant polyimide for microelectronic uses.

The polyamic acid of the present invention is generally resistant to photoresist chemicals (for example, propylene glycol monomethyl ether acetate, 2-ethoxyethyl acetate, and propylene glycol monomethyl ether) and developers which include basic aqueous solutions of tetramethylammonium hydroxide or sodium hydroxide. Further, the polyamic acid of the present invention can be etched by wet-etch solutions which can contain chemicals such as triethanolamine, butanol, ethanol, and poly(vinylmethylether).

DESCRIPTION OF THE INVENTION

In greater detail, the aromatic moieties, Ar and $Ar_1$ in Formulas I and II, are characterized by a single aromatic ring or by two or more such rings which are fused together or are joined by one or more stable linkages, such as a covalent carbon-carbon bond, oxy, sulfonyl, carbonyl, fluoroalkylene, alkylene, and the like. The aromatic moieties, Ar and $Ar_1$, can include tetravalent moieties of benzene, naphthalene, phenanthrene, anthracene, and the like. Further, the aromatic rings can be unsubstituted or substituted, for example, with one or more aromatic, lower alkyl or fluoroalkyl groups, or halogen.

Specific examples of suitable Ar and $Ar_1$ moieties include

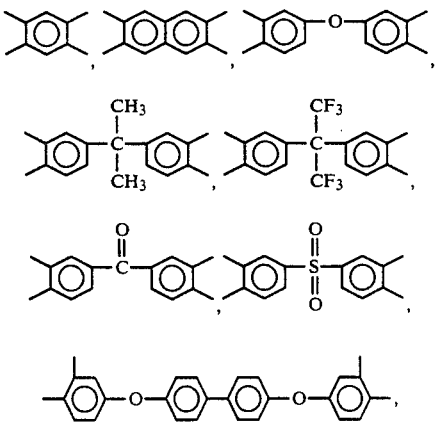

-continued

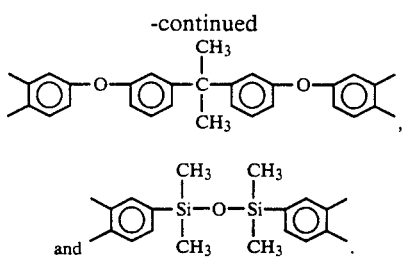

and

Suitable dianhydrides include the dianhydrides of benzene, naphthalene, diphenylether, benzophenone, diphenylsulfone, diphenylpropane, and diphenylhexafluoropropane, such as, for example, pyromellitic dianhydride (PMDA), 3,3',4,4'-tetracarboxybenzophenone dianhydride (BTDA), bis-(3,4-dicarboxyphenyl)ether dianhydride (OPAN), bis(3,4-carboxyphenyl)sulfone dianhydride (SPAN), 2,2-bis(3,4-dicarboxyphenyl)propane dianhydride (IPAN), 2,2-bis(3,4-dicarboxyphenyl)hexafluoropropane dianhydride (6FDA), and the like. Suitable dianhydrides can also include 1,3-bis(3,4-dicarboxyphenyl)tetra-methyldisiloxane dianhydride (PADS), and the like.

The divalent hydrocarbon moieties, R, $R_1$, $R_3$, and $R_4$ in Formulas I and II, are individually selected from an aliphatic or an aromatic moiety. The aliphatic moiety is characterized by a straight or branched-chain hydrocarbon, such as, for example, methylene, ethylene, propylene, tetramethylene, hexamethylene, octamethylene, nonamethylene, decamethylene, dodecamethylene, and the like, which can be unsubstituted or substituted with one or more halides such as fluorine, or lower alkyl groups such as, for example, 2,2,4-trimethylhexamethylene, 2,2-dimethylpropylene, and the like. The aliphatic moiety can also incorporate segments such as, for example, xylylene diamine or less than about 10 mol % of a polydimethylsiloxane.

The aromatic moiety is characterized by a single aromatic ring or by two or more such rings which are fused together or are joined by one or more stable linkages, such as a covalent carbon-carbon bond, oxy, sulfonyl, carbonyl, alkylene, fluoroalkylene, and the like. The aromatic moiety can include divalent moieties of benzene, naphthalene, phenanthrene, anthracene, and the like. Further, the aromatic rings can be unsubstituted or substituted, for example, with one or more halide, lower alkyl, fluoroalkyl, or aromatic groups.

The polyamic acid typically is made from aromatic dianhydrides, including their ester and acid forms, and at least one aromatic diamine. Suitable diamines include 2,2-bis(4-(p-aminophenoxy)phenyl)hexafluoropropane (BDAF), 3,5-diamino-t-butylbenzene (DATB), 3,5-diaminobenzotrifluoride (DABF), 4,4'-bis(p-aminophenoxy)biphenyl (APBP), 2,2-bis(4-aminophenyl)propane (BAA), 2,2-bis(4-aminophenyl)hexafluoropropane (BAAF), 4,4'-bis(4-amino-2-trifluoromethylphenoxy)biphenyl (FAPB), m-phenylenediamine (MPDA), p-phenylenediamine (PPDA), 4,4'-diaminodiphenylether (OBA), 3,4'-diaminodiphenylether (3,4'-OBA), 2,2-bis[4-(p-aminophenoxy)phenyl]propane (BAPP), 4,4'-[1,4-phenylenebis(1-methylethylidene)]bisaniline (BAP), 3',5-diamino-1,3,3,6'-tetramethyl-1-(4'-tolyl)indan (DATI), and the like.

The following abbreviations as used herein are defined as follows:

| ABBREVIATION | FULL NAME |
|---|---|
| APBP | 4,4'-bis(p-aminophenoxy)biphenyl |
| BAA | 2,2-bis(4-aminophenyl)propane |
| BPDA | 3,3',4,4'-tetracarboxybiphenyl dianhydride |
| BTDA | 3,3'4,4'-tetracarboxybenzophenone dianhydride |
| CODA | 4,4'-diamino-3-carboxamidodiphenylether, also called 3-carboxamido-4,4'-oxydianiline |
| 6FDA | 2,2-bis(3,4-dicarboxyphenyl)hexafluoropropane dianhydride, also called 2,2-bis(3,4-dicarboxyphenyl)hexafluoroisopropylidene dianhydride |
| NMP | N-methylpyrrolidone, also called 1-methyl-2-pyrrolidinone |
| ODA | 4,4'oxydianiline, also called 4,4'-diaminophenylether |
| PMDA | pyromellitic dianhydride |

As used herein the polyamic acid of the present invention is the precursor to the cured polyimide of the present invention. In addition, the composition of this invention is found in several forms. When the polymer is first prepared, it is essentially in the polyamic acid form. However, the polymer is in a dynamic state and some polyimide may be present. Likewise, after the polyamic acid is cured to the polyimide form, some polyamic acid may be present. Accordingly, it is to be understood that although the polymer may be primarily in one form or the other, some degree of both forms may be present.

The typical interconnection network process requires a multistep procedure. Briefly, polyamic acid is typically made by dissolving a diamine in a solvent and then adding a dianhydride to form a solution of polyamic acid. The resulting solution of polyamic acid is spread on a substrate to form a polymer coating and heated (soft-baked) to remove the solvent.

The polymer layer is typically etched to provide openings (vias) through the polymer coating. These openings provide access for connections between conductor layers or between the conductor layers and the outside environment. There are two conventional methods for etching the polymer, dry-etching and wet-etching.

Dry-etching is performed on the fully or substantially fully cured polyimide and can include, for example, laser drilling (laser ablation), the use of gaseous plasmas of oxygen or oxygen/carbon fluoride containing mixtures which are exposed to the polyimide, and the like.

Polymer wet-etching processes differ depending on the state of cure (or imidization) of the polymer. Fully or substantially fully cured polyimides can be etched using either hydrazine hydrate or ethylene diamine. Wet-etching of uncured or partially cured polyamic acid films can include the use of basic solutions, for example, aqueous solutions of either tetramethylammonium hydroxide or sodium hydroxide. Alternatively, wet-etching can include the use of non-ionic base wet-etch solutions.

Typically, in a wet-etching process, the polyamic acid is coated on the substrate and soft-baked to remove the solvent. The polyamic acid coating can then be etched either along with the development and removal of the photoresist material or through the windows created in the photoresist material. After the polyamic acid is etched, the unexposed photoresist is removed, and the polyamic acid is imidized to form the polyimide.

A conductor layer is then applied to the polyimide layer. The layer of conducting material can be placed onto the coated substrate by standard techniques which are well known in the art, such as, for example, electroplating, sputtering, evaporation, and the like.

The conductor layer is further coated with a photoresist material and the solvent is removed (soft-baked). The photoresist material is then shielded with a photomask, exposed to actinic radiation, and the exposed areas are removed to provide uncovered areas of conductor layer (windows).

The conducting material can be etched through the windows in the photoresist material, generally by contacting the conducting material with an etchant that is specific for that material, and the photoresist material is removed. Thereafter, a second layer of polyamic acid can be applied, etched, and cured. This process is repeated to form a structure having the desired number of layers. Typically, the structure will have 1 to 6 layers of conducting material, but the structure can have many more layers.

In still greater detail, the polyamic acid of the present invention are generally prepared in accordance with known polycondensation methods which are described in detail in Polyimides-Thermally Stable Polymers, Plenum Publishing (1987), incorporated herein by reference. The total diamine and total dianhydride components are present in a ratio of approximately 1:1. However, by using an excess of diamine or dianhydride in the reaction mixture (preferably ranging from about 0.9:1.1 to about 1.1:0.9), the chain length of the product can be adjusted. Further, the chain length can be restricted by adding a predetermined quantity of a monoamine or a dicarboxylic acid anhydride to the reaction mixture. The reaction generally takes place at from about minus 10° C. to about 100° C.

The solution of polyamic acid is spin-coated onto a substrate, such as a silicon wafer. In general, the solution of polyamic acid is diluted before it is spread on the substrate. The degree of dilution of the solution of polyamic acid is based on the thickness requirement of the final coating, the viscosity and solids content of the solution, and the spin curve data for the polyamic acid. Solutions of the polyamic acid generally range from about 5 to about 50 weight percent, preferably, from about 10 to about 40 weight percent, depending upon the molecular weight, to provide the proper viscosity for application to the substrate by spin coating.

The spin curve data can be obtained by spin-coating the polyamic acid onto the substrate at various spin speeds, curing the polyamic acid, measuring the resulting thickness, and plotting thickness versus spin speed. The diluted solution is generally filtered before further processing.

The polyamic acid solution can be applied either statically or dynamically. In static application, the polyamic acid solution is dispensed to a nonrotating substrate and spread across the surface by spinning. In dynamic application, the polyamic acid solution is dispensed to a rotating substrate. In either case, the substrate is spun at a spin speed which is determined from the spin curve for the final coating thickness required.

Alternatively, the polyamic acid can be applied to suitable carriers, or substrates, by other conventional methods, which can include, but are not necessarily limited to, dipping, brushing, casting with a bar, roller-coating, spray-coating, dip-coating, whirler-coating, cascade-coating, curtain-coating, or other methods.

Substrates can be any material that is not decomposed in the high temperatures that are required for processing. Examples of suitable carriers, or substrates, are: plastics; metal and metal alloys, such as aluminum, copper, and the like; semi metals; semiconductors, such as Si, Ge, GaAs, glass, ceramics; and other inorganic materials, for example, $SiO_2$ and $Si_3N_4$, and the like. Further, the substrate can be dried (dehydration) to remove moisture on the surface of the substrate before the application of the polyamic acid.

If desired, an adhesion promoter can be used to assist in adhering the polymer to the substrate. Adhesion promoters are well known and are commercially available. A suitable adhesion promoter is 3-aminopropyltriethoxysilane (APES).

Alternatively, a minor amount of siloxane moiety can be incorporated into the polymer to improve the adhesion of the polymer to the substrate. In this case, less than about 10 weight percent siloxane moiety can be added so long as the thermal properties and chemical resistance of the polymer are not severely affected. Suitable siloxane moieties are typically derived from siloxane-containing diamines having from 1 to about 40 disubstituted siloxyl units. Suitable siloxane diamines include, for example, bis-aminopropyl polydimethylsiloxane, bis-aminopropyl polydiethylsiloxane, bis-aminopropyl polydipropylsiloxane, diphenyl siloxanes, 1,3-bis(3,4-dicarboxyphenyl)tetramethyldisiloxane dianhydride (PADS), and the like.

Conventional methods for etching the polymer coating include dry-etching and wet-etching. As indicated above, dry-etching is performed on the fully or substantially fully cured polyimide and can include, for example, laser drilling (laser ablation) or the use of gaseous plasmas of oxygen or oxygen/carbon fluoride containing mixtures which are exposed to a polyimide, and the like.

Polymer wet-etching processes differ depending on the state of cure (or imidization) of the polymer. As indicated above, fully or substantially fully cured polyimides can be etched using either hydrazine hydrate or ethylene diamine. Wet-etching of uncured or partially cured polyamic acid films can include the use of basic solutions, for example, aqueous solutions of either tetramethylammonium hydroxide or sodium hydroxide.

Wet-etching a polyamic acid can include the use of the non-ionic base wet-etch solutions that are described and claimed in application Ser. No. 605,555, filed on Oct. 30, 1990, fully incorporated herein by reference. For example, a 6FDA/APBP polyamic acid can be etched with an aqueous solution of a non-ionic base such as triethanolamine (TEA), and a substituted hydrocarbon solvent such as methanol, wherein a major portion of the solution is water and less than 1 weight percent of the total composition of the solution is an ionic base such as tetramethylammonium hydroxide (TMAH).

Typically, in a wet-etching process, the polyamic acid is coated on the substrate and soft-baked to remove the solvent. The polyamic acid-coated substrate is then coated with a photoresist material, typically a positive photoresist material (for example, a commercially available, light sensitive polymer is available from Hoechst AG under the tradename AZ 1350J ®), and the coated substrate is heated at an elevated temperature (from about 75° C. to about 150° C.) to remove the solvents from the photoresist material.

The photoresist material is then covered with a photomask containing a pattern of openings which are positioned where openings through the polymer are desired in the polyimide coating. The photoresist material is thereafter exposed to actinic radiation (such as UV light) to convert the photoresist material by photochemical reaction from an insoluble material to one that is soluble in basic aqueous developer solvents, and the photomask is taken away. Thus, photoresist material can be selectively removed to form windows that uncover the polyamic acid coating.

The exposed photoresist material is typically developed (or dissolved and removed), for example, by an aqueous solution consisting essentially of tetramethylammonium hydroxide (TMAH), which is commercially available under the trademark Shipley ® 312. The developer solution forms water soluble salts with the exposed photoresist material and effectively allows the exposed photoresist material to be washed away. The unexposed positive photoresist material is not soluble in the aqueous base; therefore, the polyamic acid that is underneath the unexposed photoresist material is protected from the aqueous base by the layer of unexposed photoresist material.

The polyamic acid can now be selectively etched through the windows in the photoresist material. This requires etching vias (or openings) through the polyamic acid to permit access for electrical connections between the conductor layers and the outside environment. In the case of a multilayer interconnect structure, access is required for connections between conductor layers, or between the conductor layers and the outside environment. These openings are typically in the shape of a square and are from about 15 to about 500 microns on a side but can be as small as 1 micron on a side. Other shapes can include, for example, octagonal, round, and the like.

The polyamic acid which is located under the windows is now uncovered and can be etched with the wet-etch composition. The wet-etch composition is generally maintained at a temperature of from about 0° C. to about 60° C.

There are generally at least two wet-etch procedures for etching a polyamic acid coated substrate; dip-etching and spray-etching. In dip-etching, the coated substrate or layered module is dipped into a container of the wet-etch composition, and the polyamic acid is allowed to dissolve. The polyamic acid effectively dissolves as an infinite dilution. In spray-etching, a mist of etchant is applied to the surface of a rotating substrate or module. In this manner, fresh etchant is continually delivered to the surface, and dissolved polyamic acid is continually being spun off. A particular etchant can behave differently in the dip-etch and spray-etch method. Also, mechanical agitation will affect the outcome of the dip-etch application procedure.

The cure can be completed, typically by thermal means. Thermal imidization is typically carried out at a temperature range from about 100° C. to about 500° C., more typically from about 250° C. to about 400° C.

In a dry-etching process, the polyamic acid is coated on the substrate and fully, or substantially fully imidized (cured). The cure temperature typically ranges from about 100° C. to about 500° C., more typically from about 250° C. to about 400° C. The curing cycle can be ramped by increasing the curing temperature in stages from about one hour to about eight hours. This is the polyimide layer that is to be etched to provide openings for connections between the conductor layer and the outside environment.

The polyimide layer is covered with an etch barrier. Typically, the etch barrier is an inorganic material, such as silicon dioxide. Under dry-etch conditions, the photoresist material and the polyimide layer will etch at the same rate. Therefore, the etch barrier is used to protect the polyimide layer.

The etch barrier is then coated with a photoresist material, typically a positive photoresist material (for example, a commercially available, light sensitive polymer is available from Hoechst AG under the tradename AZ1350J ®), and the coated substrate is heated at an elevated temperature (from about 75° C. to about 150° C.) to remove the solvents from the photoresist material.

The photoresist material is then covered with a photomask containing a pattern of openings which are positioned where openings through the polyimide are desired. The photoresist material is thereafter exposed to actinic radiation (such as UV light) to convert the photoresist material by photochemical reaction from an insoluble material to one that is soluble in basic aqueous developer solvents. Thus, the photoresist material can be selectively removed to form windows over the etch barrier.

The exposed photoresist material is typically developed (or dissolved and removed), for example, by an aqueous solution consisting essentially of tetramethylammonium hydroxide (TMAH), which is commercially available under the trademark Shipley 312. The developer solution forms water soluble salts with the exposed photoresist material and effectively allows the exposed photoresist material to be washed away. The unexposed positive photoresist material is not soluble in the aqueous base; therefore, the etch barrier layer that is underneath the unexposed photoresist material is protected from the aqueous base by the layer of unexposed photoresist material.

The etch barrier can now be selectively etched through the windows in the photoresist material. Etching vias (or openings) through the etch barrier to permit access to the polyimide layer can be accomplished by procedures that are well known in the art. For example, when the etch barrier is a silicon dioxide material, it can be etched using dilute hydrofluoric acid.

The polyimide layer can now be etched through the openings in the etch barrier. Etching of the polyimide layer is accomplished by procedures that are well known in the art, for example, using gaseous plasmas such as oxygen plasma.

The photoresist material is then removed, typically using oxygen plasma or a commercial photoresist stripper. Thereafter, the remaining etch barrier is removed by methods that are well known in the art. For example, when the etch barrier is a silicon dioxide material it can be removed using dilute hydrofluoric acid. Thus, the polyimide layer, which now has openings, is uncovered, and is ready for the application of a layer of conducting material.

Before the conducting material is applied, the surface of the polyimide can be plasma-etched or reactive ion-etched with a plasma to enhance the adhesion between the polyimide and the conducting material.

The layer of conducting material can be placed onto the coated substrate by standard techniques, such as electroplating, sputtering, evaporation, and the like. For example, aluminum can be deposited by E-beam evaporation and patterned using microlithography and a mask. Typically, the conducing material is applied with a sputtering machine (such as the sputtering machine sold by CVC Products).

The conducting material is typically etched to form a pattern of conducting material over the underlying polyimide. Etching is generally accomplished by coating the conducting material with a photoresist material and etching the photoresist material as described above. The conducting material is then etched through the windows in the photoresist material, generally by contacting the conducting material with an etchant that is specific for that material. For example, aluminum can be plasma-etched, reactive ion-etched, or etched with an aqueous solution of phosphoric acid, acetic acid, and nitric acid. Aluminum etchants are commercially available, for example, from KTI, Sunnyvale, Calif.

Thereafter, a second layer of polyamic acid can be applied, cured, and etched as described above, to form openings between the conducting layer and the outside environment. This process is repeated to form a structure having the desired number of layers. Typically, the structure will have 1 to 6 layers of conducting material, but multilayer structures can have many more layers.

Other customary additives which do not have an adverse influence on the usefulness of the polyimide in a multilayer application can be incorporated in the coating during preparation of the coating composition. Examples of these additives are delustering agents, flow control agents, fine-particled fillers, flameproofing agents, fluorescent brighteners, antioxidants, light stabilizers, stabilizers, dyes, pigments, adhesion promoters, and antihalo dyes.

The following examples will serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

All percents used are weight percents.

Solution viscosity was determined using a Brookfield Viscometer as described in ASTM D789-86 and is reported in centipoise units Inherent Viscosity (IV) was determined at approximately 0.5 g/dl in NMP at 25° C. as described in ASTM D2857.

Monomers and solvents were purchased from commercial sources.

The polyamic acid precursors in the following examples were prepared at room temperature.

CHEMICAL RESISTANCE TESTING PROCEDURE

The chemicals used to test the following Examples were preheated to 85° C., unless noted otherwise. The polymer coated substrate was submerged in solvent for approximately 15 minutes. The coated substrates were rinsed in deionized water, dried, and baked in an oven with a nitrogen purge for ten minutes at 100° C.

The polyimide coating thickness was measured using a Tencor ® stylus profileometer model Alpha-step 200. The polyimide layer was measured both before, and after, the chemical resistance testing procedure. The difference, or loss in polyimide thickness, was used to determine whether, and to what extent, the particular chemical or solvent attacked the polyimide layer.

Examples 1-7 are different synthesis reaction sequences used to prepare polyamic acid compositions having a molar ratio of 75 6FDA/25 BPDA/100 APBP. The reaction sequences are reported in Table I below. It is believed that the sequence of addition of the monomers affects the viscosity stability of the polyamic acid of the present invention. However, even the reaction sequence that produced the less stable polyamic acid in the following BPDA containing Examples provided a polyimide that was more chemically resistant than polyimides without BPDA. See Examples 8, 17, and 18 compared to Example 1, in Table X. Tables II, IV, and VII-XI illustrate the chemical resistance of the polyimide of the present invention toward EKC830 ® which is believed to be a mixture of 49% 2-(2-aminoethoxy)ethanol and 51% NMP. EKC830 is sold as a photoresist stripper and is commercially available from EKC Technologies, Inc. (California). It is believed that the amine moiety of the photoresist stripper EKC830 attacks the polymer, therefore, it is considered more aggressive than a typical solvent, for example, NMP.

TABLE I

| Example 1-7 Synthesis Reaction Sequences | |
| --- | --- |
| Example Number | Sequence |
| 1 | add BPDA first, then 6FDA |
| 2 | larger scale batch following the procedure of Example 1 |
| 3 | blend BPDA/APBP and 6FDA/APBP polyamic acids |
| 4 | add 6FDA first, then BPDA |
| 5 | BPDA and 6FDA slurried, then added |
| 6 | larger scale batch following the procedure of Example 5 |
| 7 | add mixture of solid anhydrides to APBP solution |

EXAMPLE 1

75 6FDA/25 BPDA/100 APBP

To a solution of 40.544 grams of APBP in 370 grams of NMP was added a slurry of 7.859 grams of BPDA in 123 grams of NMP. After mixing until the BPDA was dissolved, a slurry of 35.597 grams of 6FDA in 123 grams of NMP was added to the BPDA/APBP solution. After stirring overnight the polyamic acid solution had a Brookfield viscosity of 1,010 Cp and an IV of 0.92 dl/g (0.5% in NMP).

Three inch diameter silicon substrates were cleaned with i-propanol alcohol. To each of the cleaned substrates was applied 3 ml of an adhesion promoter solution. The adhesion promoter solution was prepared by diluting concentrated 3-aminopropyltriethoxysilane (APES) as follows: concentrated adhesion promoter was diluted 1 part APES to 2,000 parts 95% methanol/5% water. The coated substrates were spun 5 sec at 500 rpm to spread the adhesion promoter, and 30 sec at 4,000 rpm to dry the adhesion promoter.

Approximately 3 ml of the polyamic acid containing solvent solution was dispensed onto the substrates and spun 30 sec at 500 rpm to spread the polyamic acid, then 60 sec at desired spin speed to yield a uniform coating. The polyamic acid coated substrate was baked in an oven for ten minutes at 100° C. with a nitrogen purge, then the temperature was ramped to 200° C. over 20 minutes, and held at 200° C. for 60 minutes. The wafer was removed from the oven and transferred to a tube furnace where it was imidized at 400° C. for 60 minutes.

The photoresist EKC830 was heated to determine whether an increase in temperature would effect the chemical resistance of the copolymer. The results are reported in Table II below. As can be seen, there was no substantive loss in polymer thickness up to 80° C.

TABLE II

| | Effect of EKC830 Temperature | | | |
|---|---|---|---|---|
| Polymer Example | Temp (°C.) | Thickness Change (microns) | Initial Thickness (microns) | Final Thickness (microns) |
| 1 | 70 | 0.00 | 1.34 | 1.34 |
| 1 | 75 | 0.00 | 1.30 | 1.30 |
| 1 | 80 | 0.00 | 1.32 | 1.32 |
| 1 | 85 | −0.09 | 1.31 | 1.22 |
| 1 | 90 | −0.20 | 1.31 | 1.11 |

EXAMPLE 2

75 6FDA/25 BPDA/100 APBP

A polymer was prepared in a manner similar to Example 1 using 144.071 grams of APBP, 28.198 grams of BPDA, 127.730 grams of 6FDA, and 2,200.5 grams of NMP. The IV and Brookfield viscosities were monitored over time and found to change slowly until essentially reaching an equilibrium value, these values are reported in Table III below.

TABLE III

| Example Number | Day | Brookfield Viscosity (cP) | Inherent Viscosity (dl/g) |
|---|---|---|---|
| 2 | 1 | 5540 | 1.30 |
| 2 | 2 | 4710 | no data |
| 2 | 4 | 3790 | no data |
| 2 | 8 | 2890 | no data |
| 2 | 14 | 2520 | no data |
| 2 | 21 | 2450 | no data |
| 2 | 24 | no data | 1.12 |

The copolymer thickness was varied to determine whether the polymer thickness would effect the chemical resistance of the copolymer. As seen in Table IV below, the thickness loss remained essentially consistent as the initial thickness was varied from 1.12 microns to 3.08 microns.

TABLE IV

| | Effect of Coating Thickness | | |
|---|---|---|---|
| Example Number | Thickness Change (microns) | Initial Thickness (microns) | Final Thickness (microns) |
| 2 | −0.12 | 3.08 | 2.96 |
| 2 | −0.11 | 2.11 | 2.00 |
| 2 | −0.05 | 1.57 | 1.52 |
| 2 | −0.10 | 1.30 | 1.20 |
| 2 | −0.09 | 1.12 | 1.03 |

EXAMPLE 3

75 6FDA/25 BPDA/100 APBP

A polymer solution having a 3:1 molar ratio of dianhydrides 6FDA:BPDA was prepared by mixing 11.45 grams of FDA/APBP polyamic acid (11.45% solids in NMP) with 2.35 grams of BPDA/APBP polyamic acid (15.0% solids in NMP). The resulting solution was 115.7 grams at 11.94% solids and, had an IV of 1.18 dl/g (0.5% in NMP) and a Brookfield viscosity of 3,000 cP.

EXAMPLE 4

75 6FDA/25 BPDA/100 APBP

To a solution of 28.96 grams of APBP in 220 grams of NMP was added a slurry of 25.43 grams of 6FDA in 110 grams of NMP. After mixing until the 6FDA was dissolved, a slurry of 5.61 grams of BPDA in 110 grams of NMP was added. After mixing five days the Brookfield viscosity was 810 cP. An additional 0.3 grams of 6FDA was added to the solution to adjust the viscosity, then the IV was measured to be 0.88 dl/g.

EXAMPLE 5

75 6FDA/25 BPDA/100 APBP

To a solution of 28.96 grams of APBP in 220 grams of NMP was added a slurry of 25.43 grams of 6FDA and 5.61 grams of BPDA in 176 grams of NMP, followed by a rinse of another 44 grams of NMP. After stirring for 5 days at 20° C. the Brookfield viscosity was 320 cP. An additional 0.6 grams of 6FDA was added to the solution to adjust the viscosity, then the IV was measured to be 0.71 dl/g.

EXAMPLE 6

75 6FDA/25 BPDA/100 APBP

In a manner similar to Example 5, a polymer solution was prepared using 172.90 grams of APBP, 153.26 grams of 6FDA, 33.84 grams of BPDA, and 2641 grams of NMP. The IV and Brookfield viscosities were monitored and are reported in Table V below.

TABLE V

| Example Number | Day | Brookfield Viscosity (cP) | Inherent Viscosity (dl/g) |
|---|---|---|---|
| 6 | 1 | 1680 | 1.02 |
| 6 | 2 | 1660 | no data |
| 6 | 5 | 1650 | no data |

The Brookfield viscosity is stable when the polymer is prepared as described in Example 6. An additional 0.78 grams of 6FDA and 93.53 grams of NMP were added to the solution to adjust the viscosity to an IV of 1.13 dl/g and a Brookfield viscosity of 2,580 cP.

EXAMPLE 7

75 6FDA/25 BPDA/100 APBP

To a solution of 40.344 grams of APBP in 308 grams of NMP was slowly added a powder mixture of 35.76 grams of 6FDA and 7.90 grams of BPDA, followed by the remaining 308 grams of NMP. The Brookfield viscosity is reported in Table VI below.

TABLE VI

| Example Number | Day | Brookfield Viscosity (cP) |
|---|---|---|
| 7 | 1 | 2810 |

TABLE VI-continued

| Example Number | Day | Brookfield Viscosity (cP) |
|---|---|---|
| 7 | 7 | 2850 |

As seen in Table VI, the Brookfield viscosity of the copolymer of Example 7 remained stable over a 7 day period. An additional 13.4 grams of NMP was added to adjust the viscosity to an IV of 1.14 dl/g and a Brookfield viscosity of 2560 cP.

Example 2, Table III, appeared to have an unstable viscosity when monitored over 24 days. However, it is believed that refrigeration would stabilize the viscosity of this Example. Examples 6-7 remained essentially stable over a 5-7 day period of time. These are the Examples where the dianhydrides were mixed or slurried before they were reacted with the diamine. Thus, the synthesis procedures of Examples 6-7 are preferred.

The effect of a particular synthesis reaction sequence on chemical resistance is reported in Table VII below.

TABLE VII

| Polymer Example | Thickness Change (microns) | Initial Thickness (microns) | Final Thickness (microns) |
|---|---|---|---|
| 1 | −0.04 | 1.31 | 1.27 |
| 2 | −0.05 | 1.57 | 1.52 |
| 3 | −0.23 | 2.33 | 2.10 |
| 3 | −0.24 | 2.33 | 2.09 |
| 3 | −0.02 | 2.21 | 2.19 |
| 4 | −0.23 | 2.33 | 2.10 |
| 5 | −0.03 | 0.79 | 0.76 |
| 6 | −0.03 | 1.59 | 1.56 |
| 7 | −0.02 | 1.55 | 1.53 |

Example 3 was prepared as a blend of the polymers 6FDA/APBP and BPDA/APBP. It is believed that when the polymers are first blended they did not form a block copolymer. However, over time the segments rearranged and become more random such that a copolymer was formed. This can be seen in Table VII where the polymer was tested after two weeks and again after a total of seven weeks. Over the seven week time period, the thickness change fell from a −0.23 micron thickness change to a −0.02 micron thickness change.

Examples 8-13 illustrate the preparation of copolymers containing dianhydride (6FDA/BPDA) ratios from 0/100 to 100/0. As reported in Table VIII below, the chemical resistance increases with increasing proportions of BPDA. The most preferred composition will depend on the amount of solvent resistance desired for a particular application.

EXAMPLE 8

6FDA/APBP

A copolymer was prepared having no BPDA. To a solution of 179.7 grams of APBP in 2608.9 grams of NMP was added 210.4 grams of 6FDA. After mixing overnight the Brookfield viscosity was 4620 cP. An additional 403.1 grams of NMP was added to adjust the viscosity to 2280 cP. The IV was 1.18 dl/g (0.5% in NMP).

EXAMPLE 9

90 6FDA/10 BPDA/100 APBP

In a manner similar to Example 1, a copolymer having a 6FDA/BPDA mole ratio of 90/10 was prepared using 39.42 grams of APBP, 41.53 grams of 6FDA, 3.056 grams of BPDA, and 617 grams of NMP. After mixing overnight, an additional 0.035 grams of BPDA was added to adjust the Brookfield viscosity to 840 cP, and the IV to 0.86 dl/g (0.5% in NMP).

EXAMPLE 10

65 6FDA/35 BPDA/100 APBP

In a manner similar to Example 7, a copolymer having a 6FDA/BPDA mole ratio of 65/35 was prepared using 41.13 grams of APBP, 31.60 grams of 6FDA, 11.27 grams of BPDA, and 616 grams of NMP. After mixing overnight, an additional 45.5 grams of NMP was added to adjust the viscosity to 2960 cP and the IV to 1.24 dl/g (0.5% in NMP).

EXAMPLE 11

50 6FDA/50 BPDA/100 APBP

In a manner similar to Example 1, a copolymer having a 6FDA/BPDA mole ratio of 50:50 was prepared using 42.68 grams of APBP, 24.86 grams of 6FDA, 16.46 grams of BPDA, and 616 grams of NMP. After mixing overnight, the Brookfield viscosity was 944 cP and the IV was 0.89 dl/g.

EXAMPLE 12

25 6FDA/75 BPDA/100 APBP

In a manner similar to Example 1, a copolymer having a 6FDA/BPDA mole ratio of 25/75 was prepared using 44.82 grams of APBP, 13.12 grams of 6FDA, 26.06 grams of BPDA, and 616 grams of NMP. After mixing overnight, the Brookfield viscosity was 1960 cP and the IV was 1.02 dl/g.

EXAMPLE 13

BPDA/APBP

A polymer was prepared having no 6FDA. To a solution of 16.97 grams of APBP in 90 grams of NMP was added 13.03 grams of BPDA, followed by an additional 80 grams of NMP. The solution was mixed overnight and the viscosity measured. The Brookfield viscosity was 14,080 cP and the IV was 1.12 d//g (0.5% in NMP).

TABLE VIII

Solvent Resistance of Different 6FDA/BPDA/APBP Copolymers

| Example Number | 6FDA/BPDA Ratio | Thickness Change (microns) | Initial Thickness (microns) | Final Thickness (microns) |
|---|---|---|---|---|
| 8 | 100/0 | −0.22 | 1.57 | 1.35 |
| 9 | 90/10 | −0.10 | 1.50 | 1.40 |
| 1 | 75/25 | −0.03 | 1.32 | 1.29 |
| 10 | 65/35 | +0.01* | 1.57 | 1.58 |
| 11 | 50/50 | +0.03* | 1.79 | 1.82 |
| 12 | 25/75 | +0.04* | 1.43 | 1.47 |
| 13 | 0/100 | +0.02* | 2.33 | 2.35 |

*These polymers registered a negligible gain in polymer thickness which is believed to be due to the solvent swelling of the polymer.

Examples 14-15 illustrate the synthesis of polyimides using the diamine ODA rather than APBP. The solvent resistance of these copolymers is reported in Table IX below. This shows that the solvent resistance of 6FDA/ODA can be increased in a manner similar to that observed for 6FDA/APBP by incorporating the dianhydride BPDA.

EXAMPLE 14

6FDA/ODA

In a manner similar to Example 1, a copolymer was prepared having no BPDA. To a solution of 3.798 grams of ODA in 88.0 grams of NMP was added 8.203 grams of 6FDA. After mixing overnight an additional 0.016 grams of 6FDA was added to adjust the viscosity.

EXAMPLE 15

75 6FDA/25 BPDA/100 ODA

In a manner similar to Example 1, a copolymer having a 6FDA/BPDA mole ratio of 75/25 was prepared using 20.19 grams of ODA, 32.61 grams of 6FDA, 7.20 grams of BPDA, and 440 grams of NMP. After mixing for four days the viscosity was adjusted by adding an additional 0.067 grams of 6FDA. The polymer IV was 0.64 dl/g (0.5% in NMP, 25° C.).

TABLE IX

| \multicolumn{5}{c}{Solvent Resistance of Different 6FDA/BPDA/ODA Copolymers} |
| Polymer Example | 6FDA/ BPDA | Thickness Change (microns) | Initial Thickness (microns) | Final Thickness (microns) |
|---|---|---|---|---|
| 14 | 100/0 | −0.33 | 1.07 | 0.74 |
| 15 | 75/25 | −0.12 | 0.63 | 0.51 |

Examples 16-17 illustrate the synthesis of copolymers using dianhydrides other than BPDA. The thickness loss is reported in Table X below. As can be seen from Table X, other dianhydrides do not impart the increase in chemical resistance that is seen when the dianhydride BPDA is used.

EXAMPLE 16

75 6FDA/25 BTDA/100 APBP

To a solution of 28.71 grams of APBP in 220 grams of NMP was added a solution of 6.09 grams of BTDA in 88 grams of NMP, followed by a slurry of 25.20 grams of 6FDA in 132 grams of NMP. After stirring three days an additional 0.05 grams of 6FDA was added to adjust the viscosity to a final value of 952 cP and an IV of 0.91 dl/g (0.5% in NMP, 25° C.).

EXAMPLE 17

75 6FDA/25 PMDA/100 APBP

To a solution of 29.68 grams of APBP in 220 grams of NMP was added a slurry of 4.26 grams of PMDA in 88 grams of NMP. After mixing until the PMDA dissolved, a slurry of 26.06 grams of 6FDA in 132 grams of NMP was added. An additional 0.05 grams of 6FDA and 0.70 grams of PMDA were added to adjust the Brookfield viscosity to a final value of 365 cP and an IV of 0.70 dl/g (0.5% in NMP, 25° C.).

TABLE X

| Copolymer of Other Anhydrides with 75 6FDA/25 X/100 APBP | | | | |
| Polymer Example | X | Thickness Change (microns) | Initial Thickness (microns) | Final Thickness (microns) |
|---|---|---|---|---|
| 8 | 6FDA | −0.22 | 1.57 | 1.35 |
| 1 | BPDA | −0.03 | 1.37 | 1.34 |
| 16 | BTDA | −0.24 | 1.32 | 1.08 |

TABLE X-continued

| Copolymer of Other Anhydrides with 75 6FDA/25 X/100 APBP | | | | |
| Polymer Example | X | Thickness Change (microns) | Initial Thickness (microns) | Final Thickness (microns) |
|---|---|---|---|---|
| 17 | PMDA | −0.17 | 0.94 | 0.77 |

Example 18 illustrates the synthesis of a copolymer substituting 10 mole % of the diamine CODA for APBP. CODA produces an isoquinoxaline structure when incorporated into fully cured polyimide. As seen in Table XI, this modification did not improve the chemical resistance of the resulting copolymer.

EXAMPLE 18

100 6FDA/90 APBP/10 CODA

To a solution of 14.92 grams of APBP in 164 grams of NMP were added 19.99 grams of 6FDA, followed by 1.09 grams of CODA. After stirring overnight this solution had a Brookfield viscosity of 27,600 cP and an IV of 1.11 dl/g (0.5% in NMP, 25° C.). Twenty grams of this solution was diluted by adding 11.86 grams of NMP and used for chemical resistance testing.

TABLE XI

| Copolymer with 100 6FDA/90 X/10 APBP | | | | |
| Polymer Example | X | Thickness Change (microns) | Initial Thickness (microns) | Final Thickness (microns) |
|---|---|---|---|---|
| 8 | APBP | −0.22 | 1.57 | 1.35 |
| 18 | CODA | −0.33 | 1.36 | 1.03 |

EXAMPLE 19

To a solution of 40.344 grams of APBP in 185 grams on NMP was added 3.583 grams of 6FDA. After the 6FDA had reacted, a slurry of 7.895 grams of BPDA in 246 grams of NMP was added to the solution and allowed to stir overnight. To that solution was added 32.178 grams of 6FDA followed by an additional 185 grams of NMP. After stirring overnight, the solution had a Brookfield viscosity of 3,380 cP. The Brookfield viscosity was measured over a 3 day period and found to remain essentially stable (see Table XII below). The inherent viscosity stability was measured after 3 days and was found to be 1.17 dl/g. The thickness change was measured: the initial thickness was 2.345 microns; the final thickness was 2.325 microns; and the thickness change was −0.020 microns.

TABLE XII

| Example Number | Day | Brookfield Viscosity (cP) |
|---|---|---|
| 19 | 1 | 3,380 |
| 19 | 2 | 3,250 |
| 19 | 3 | 3,170 |

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

What is claimed is:

1. A composition comprising recurring units selected from the group consisting of Formula I and Formula II

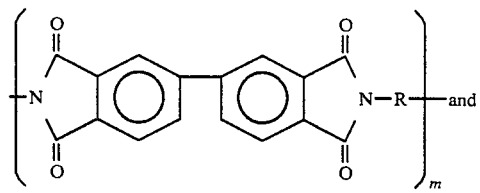

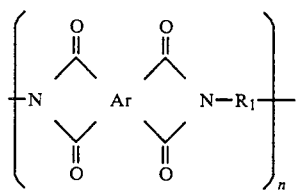

wherein Ar is a tetravalent aromatic nucleus comprising at least one mole percent

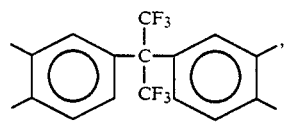

R and $R_1$ are independently selected from divalent hydrocarbon radicals, and

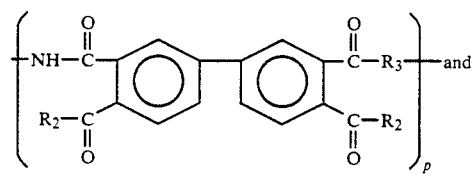

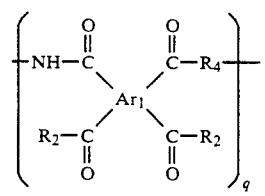

wherein $Ar_1$ is a tetravalent aromatic nucleus comprising at least one mole percent

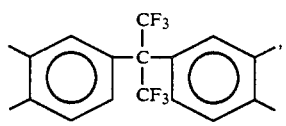

$R_3$ and $R_4$ are independently selected from divalent hydrocarbon radicals, $R_2$ is independently selected from halogen, —OH, and —$OR_5$ where $R_5$ is an alkyl group of 1 to 4 carbon atoms, and wherein the molar ratio of m plus p to n plus q is from about 1:9 to about 99:1, with the proviso that Ar and $Ar_1$ are not 3,3',4,4'-tetracarboxybiphenyl dianhydride (BPDA) moiety and with the further proviso that said composition contains less than about 10 mole percent siloxane linkages derived from siloxane diamine.

2. The composition of claim 1 wherein Ar and $Ar_1$ further comprises less than about 99 mole percent of an aromatic nucleus selected from the group consisting of

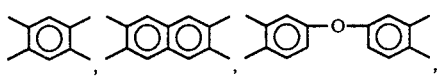

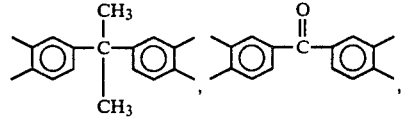

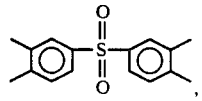

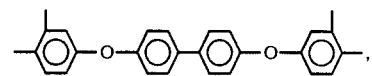

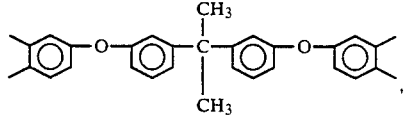

and 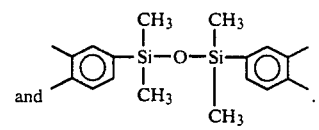

3. A method of improving chemical resistance in a polyimide comprising incorporating a 3,3',4,4'-tetracarboxybiphenyl dianhydride moiety in a polyimide having at least one mole percent 2,2-bis(3,4-dicarboxyphenyl)hexafluoropropane dianhydride.

4. The composition of claim 1 wherein R and $R_1$ are selected from the group consisting of 4,4'bis(p-aminophenoxy)biphenyl moiety, and 4,4'-diaminodiphenylether moiety.

5. The composition of claim 1 wherein the molar ratio of m plus p to n plus q is from about 1:1 to about 1:3.

6. The composition of claim 1 wherein $R_3$ and $R_4$ are both a 4,4'-bis(p-aminophenoxy)biphenyl moiety.

7. A solution containing the composition of claim 1.

8. A process for preparing a polyamic acid comprising reacting a mixture of 2,2-bis(3,4-dicarboxyphenyl)-hexafluoropropane dianhydride and 3,3',4,4'-tetracarboxybiphenyl dianhydride with 4,4'-bis(p-aminophenoxy)biphenyl.

9. A composition comprising the condensation product of 2,2-bis(3,4-dicarboxyphenyl)-hexafluoropropane dianhydride, 3,3',4,4'-tetracarboxybiphenyl dianhydride, and a diamine selected from the group consisting of 4,4'-bis(p-aminophenoxy)biphenyl and 4,4'-diaminodiphenylether.

* * * * *